United States Patent
Dhanasekaran

(10) Patent No.: US 9,306,504 B2
(45) Date of Patent: Apr. 5, 2016

(54) WAVEFORM SHAPING FOR AUDIO AMPLIFIERS

(75) Inventor: Vijayakumar Dhanasekaran, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 286 days.

(21) Appl. No.: 13/535,654

(22) Filed: Jun. 28, 2012

(65) Prior Publication Data

US 2013/0156230 A1    Jun. 20, 2013

Related U.S. Application Data

(60) Provisional application No. 61/570,740, filed on Dec. 14, 2011.

(51) Int. Cl.
  *H03F 99/00*    (2009.01)
  *H03F 1/30*    (2006.01)

(52) U.S. Cl.
  CPC ..................... *H03F 1/305* (2013.01)

(58) Field of Classification Search
  CPC ....... H03F 3/181; H03F 2200/03; H04R 3/00; H03G 3/20
  USPC ............................. 381/120, 121, 59
  See application file for complete search history.

(56) References Cited

U.S. PATENT DOCUMENTS

| | | | |
|---|---|---|---|
| 6,400,415 B1 * | 6/2002 | Danielsons | 348/608 |
| 7,215,716 B1 * | 5/2007 | Smith | 375/296 |
| 7,456,773 B1 | 11/2008 | Seo et al. | |
| 7,693,494 B2 | 4/2010 | Litmanen et al. | |
| 7,929,637 B2 * | 4/2011 | Staszewski et al. | 375/295 |
| 8,036,301 B2 | 10/2011 | Gilberton et al. | |
| 2002/0094091 A1 | 7/2002 | Wu et al. | |
| 2002/0172371 A1 * | 11/2002 | Baker et al. | 381/28 |
| 2006/0160499 A1 | 7/2006 | Puma | |
| 2007/0030038 A1 | 2/2007 | McHugh et al. | |
| 2008/0219479 A1 | 9/2008 | Ibukuro | |
| 2009/0196435 A1 | 8/2009 | Miao | |
| 2010/0009642 A1 * | 1/2010 | Pratt et al. | 455/127.1 |
| 2010/0232626 A1 * | 9/2010 | Paquier et al. | 381/119 |
| 2010/0239049 A1 | 9/2010 | Horisaki | |

FOREIGN PATENT DOCUMENTS

WO    2011010513 A1    1/2011

OTHER PUBLICATIONS

Chehri, et al. "Energy-Aware Multi-Hop Transmission for Sensor Networks based on Adaptive Modulation" 2010 IEEE 6th International Conference on Wireless and Mobile Computing, Networking and Communications, pp. 203-207.
International Search Report and Written Opinion—PCT/US2012/069943—ISA/EPO—Jun. 21, 2013.
Partial International Search Report—PCT/US2012/069943—ISA/EPO—Apr. 15, 2013.

* cited by examiner

*Primary Examiner* — Alexander Jamal
(74) *Attorney, Agent, or Firm* — James Gutierrez

(57) ABSTRACT

Techniques for applying waveform shaping to DC-to-DC level transitions in an audio amplifier. In an aspect, a waveform shaping block may utilize a non-linear shaping waveform such as a Gaussian waveform, raised-cosine waveform, root-raised cosine waveform, etc., to shape the transition between two DC levels in an audio amplifier output. The waveform shaping techniques may be utilized, e.g., during power-up or power-down of the amplifier, or in an impedance measurement mode, to reduce audio artifacts associated with the transition while minimizing overall transition time.

14 Claims, 9 Drawing Sheets

WAVEFORM SHAPING FOR AUDIO AMPLIFIERS

CLAIM OF PRIORITY UNDER 35 U.S.C. §119

The present Application for Patent claims priority to Provisional Application No. 61/570,740, entitled "Waveform shaping for audio amplifiers" filed Dec. 14, 2011, and assigned to the assignee hereof and hereby expressly incorporated by reference herein.

BACKGROUND

1. Field

The disclosure relates to the design of audio amplifiers, and, in particular, to waveform shaping for audio amplifiers.

2. Background

In the operation of audio power amplifiers (PA's), certain operational scenarios call for the output of the audio PA to be brought from one DC voltage level to another level. For example, during initial start-up or power-down of the audio PA, a DC bias or offset voltage may be established at or removed from the PA output. In particular, a DC level may normally be present at the output of the amplifier, e.g., during class A or AB operation. In this case, Vout may be brought up from 0 Volts up to the DC level during start-up of the amplifier, and conversely, Vout may be brought down from the DC level to 0 Volts during shutdown of the amplifier. Alternatively, the PA output voltage may also transition between two or more voltage levels during an impedance measurement mode, e.g., wherein a plurality of voltage-current measurements are made at the output of the PA to determine the impedance of the audio load.

In either scenario, the transitioning up or down of the amplifier output from one DC level to another DC level may undesirably generate certain audio artifacts. For example, such transitions may cause audible "pops" or "clicks" that are perceptible by a user of the audio device. To minimize such audio artifacts introduced when the amplifier output transitions from one DC level to another, a "ramping" waveform may be adopted. In particular, instead of allowing the amplifier to transition directly from one DC level to another in an uncontrolled manner, the transition may be controlled, e.g., linearly spread out over a period of time. Through such "ramping," audio artifacts at the amplifier output may be noticeably reduced. However, it would be desirable to provide techniques to further reduce such audio artifacts, as well as provide for faster convergence to the final desired DC level over time.

In general, linear ramping profiles may not necessarily offer the most optimal tradeoff between minimizing the audio artifacts generated by the transition, and minimizing the required transition time. It would be desirable to provide additional techniques for minimizing audio artifacts which simultaneously offer rapid convergence of the amplifier output to the desired DC voltage level.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein.

Figure 1:
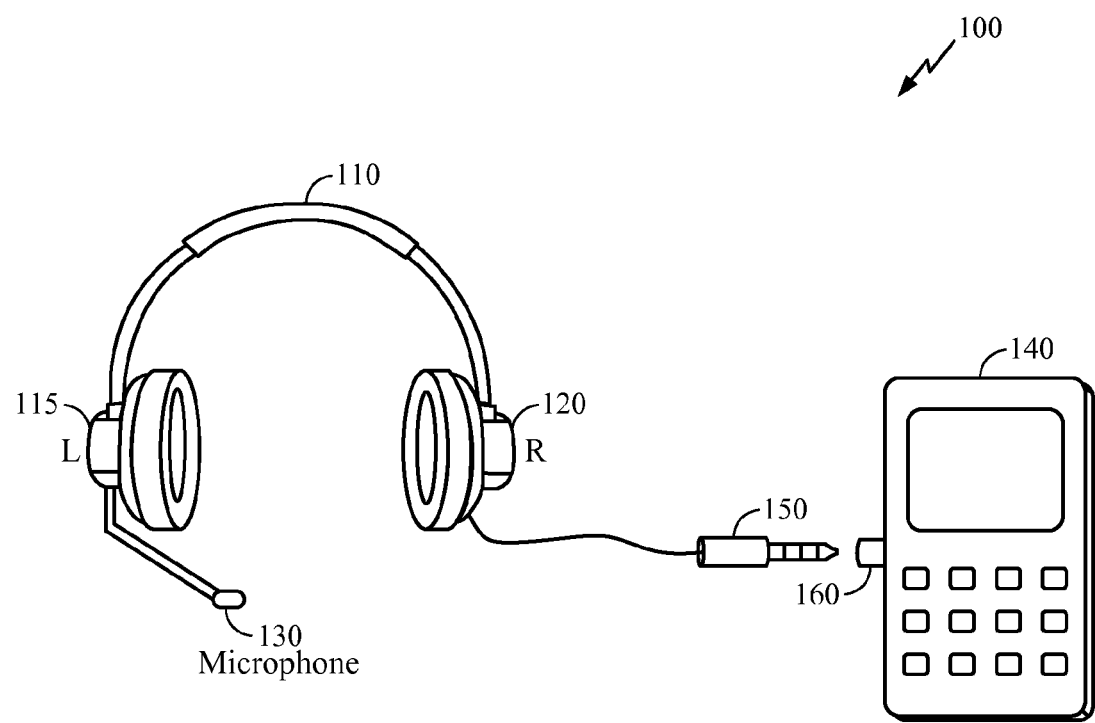
FIG. 1 illustrates an exemplary scenario 100 wherein the techniques of the present disclosure may be applied.

FIG. 1 illustrates an exemplary scenario 100 wherein the techniques of the present disclosure may be applied. It will be appreciated that FIG. 1 is shown for illustrative purposes only, and is not meant to limit the scope of the present disclosure to the particular system shown. For example, it will be appreciated that the techniques disclosed herein may also be readily applied to audio devices other than that shown in FIG. 1. Furthermore, the techniques may also be readily adapted to other types of audio devices, e.g., home stereo systems, other multi-media devices incorporating audio, devices incorporating built-in speakers, etc. Such alternative exemplary embodiments are contemplated to be within the scope of the present disclosure.

In FIG. 1, a headset 110 includes a left (L) headphone 115, a right (R) headphone 120, and a microphone 130. These components of the headset 110 are electrically coupled to terminals of a plug 150, which is insertable into a jack 160 of an audio device 140. Note the jack 160 need not extrude from the surface of the device 140 as suggested by FIG. 1, and furthermore, the sizes of the elements shown in FIG. 1 are generally not drawn to scale. The device 140 may be, for example, a mobile phone, MP3 player, home stereo system, etc.

Audio and/or other signals may be exchanged between the device 140 and the headset 110 through the plug 150 and jack 160. The plug 150 receives the audio signals from the jack 160, and routes the signals to the L and R headphones of the headset 110. The plug 150 may further couple an electrical signal with audio content generated by the microphone 130 to the jack 160, and the microphone signal may be further processed by the device 140. Note the plug 150 may include further terminals not shown, e.g., for communicating other types of signals such as control signals, etc.

Figure 2:
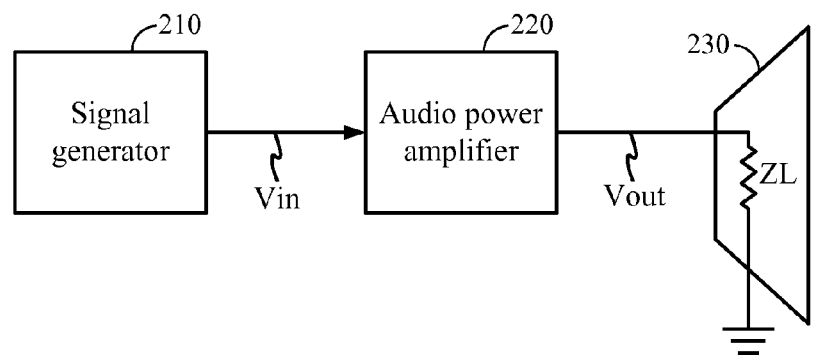
FIG. 2 illustrates audio output components known in the art.

FIG. 2 illustrates audio output components known in the art. In FIG. 2, a signal generator 210 generates a voltage Vin that is input to an audio power amplifier 220. The audio power amplifier 220 amplifies the voltage Vin to generate an output voltage Vout, which drives an audio load 230 having effective impedance ZL. Note the audio load 230 may correspond to, e.g., audio speakers, headphones, etc.

It will be appreciated that ideally, the voltage Vin generated by the signal generator 210 and provided to the audio power amplifier 220 is composed of audio signal components producing a desired audio output at the audio load 230, e.g., voice, music, digitally synthesized sounds, etc. In certain usage scenarios, however, Vin, and correspondingly, Vout, may include non-audio signal components, such as may be associated with a transition of such voltage from when DC voltage level to another. For example, such a voltage transition may occur when the audio power amplifier 220 is initially powered on, and a DC bias or offset voltage is established. Alternatively, a voltage transition may occur during certain control modes, e.g., time intervals associated with audio load impedance measurement, as further described hereinbelow.

Figure 3:
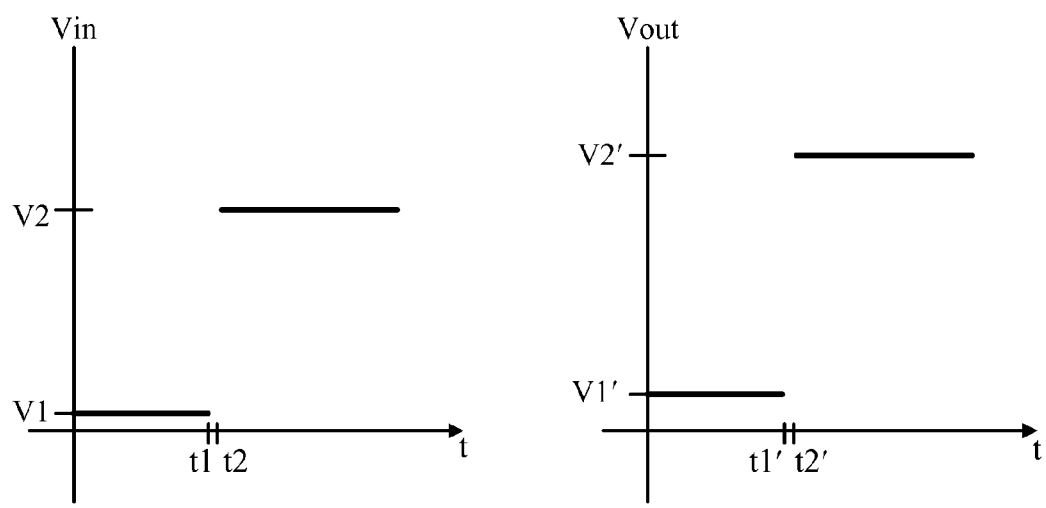
FIG. 3 illustrates a plot of the voltages Vin and Vout when a voltage level transition is present.

FIG. 3 illustrates a plot of the voltages Vin and Vout when a voltage level transition is present. Note FIG. 3 is shown for illustrative purposes only, and is not meant to limit the scope of the present disclosure to any particular types of voltage level transitions. In FIG. 3, Vin transitions from a first DC level V1 at time t1 to a second DC level V2 at time t2 (i.e., undergoes a DC-to-DC transition). The output voltage Vout correspondingly transitions from V1' to V2' during the time interval from time t1' to t2'. Note the horizontal and vertical axes of Vin and Vout in FIG. 3 are generally not shown to scale, and may depend on, e.g., the magnitude of the amplifier gain, as well as the response time of the amplifier. Further note the amplifier gain is shown in FIG. 3 as positive (i.e., an upward transition in Vin corresponds to an upward transition in Vout) for illustrative purposes only, and the techniques of the present disclosure may readily be applied to alternative exemplary embodiments wherein the amplifier gain is negative.

In prior art implementations, the voltage and timing characteristics of the V1-to-V2 transition and/or the V1'-to-V2' transition may not be otherwise controlled, e.g., the transition from V1' to V2' at the amplifier output may depend directly on the voltage level transition specifications of the amplifier, e.g., the rise-time or fall-time of the amplifier output given a corresponding voltage transition at the input. Alternatively, in certain prior art implementations, the V1-to-V2 transition and the corresponding V1'- to V2' transition may be configured to rise or fall in a straight-line ramping configuration, i.e., the transition between two input DC levels at Vin may be configured to result in a straight-line linear transition between two output DC levels at Vout.

Figure 4:
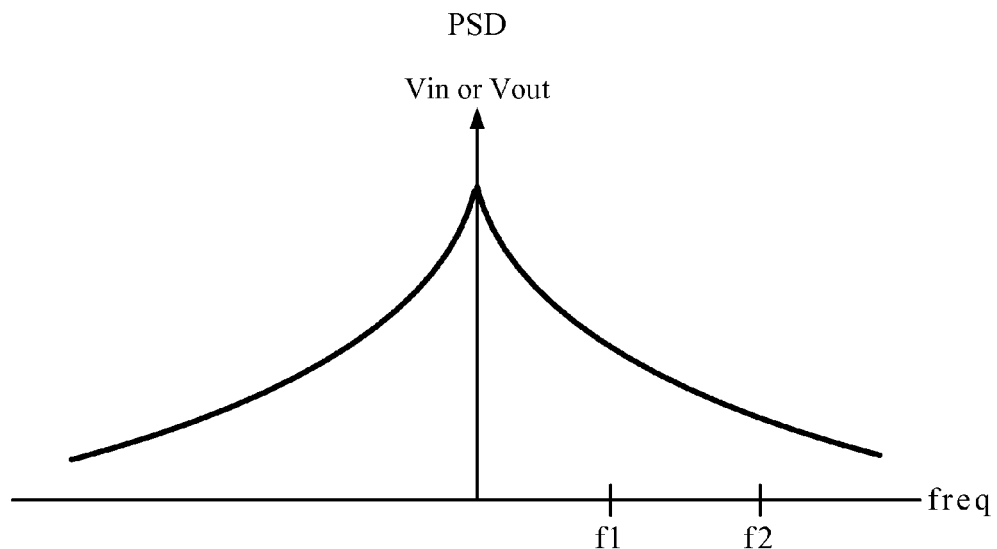
FIG. 4 illustrates an exemplary power spectral density (PSD) plot of Vin or Vout corresponding to the uncontrolled DC-to-DC transition illustrated in FIG. 3.

FIG. 4 illustrates an exemplary power spectral density (PSD) plot of Vin or Vout corresponding to the uncontrolled DC-to-DC transition illustrated in FIG. 3. It will be appreciated that the DC-to-DC transition of FIG. 3 may generate significant spectral components in Vout lying within the audible frequency range, e.g., between frequencies f1 and f2 as shown in FIG. 4. In an exemplary embodiment, f1 may correspond to 20 Hz, and f2 may correspond to 20 kHz. As Vout is subsequently coupled to the audio load 230, these spectral components may generate audio artifacts at the audio load 230 in the form of, e.g., clicks, pops, and or other noise. It would be desirable to provide techniques to minimize such audio artifacts at the audio load 230. At the same time, it would be desirable to minimize the transition time, e.g., the time interval t2'-t1' as shown in FIG. 3.

Figure 5:
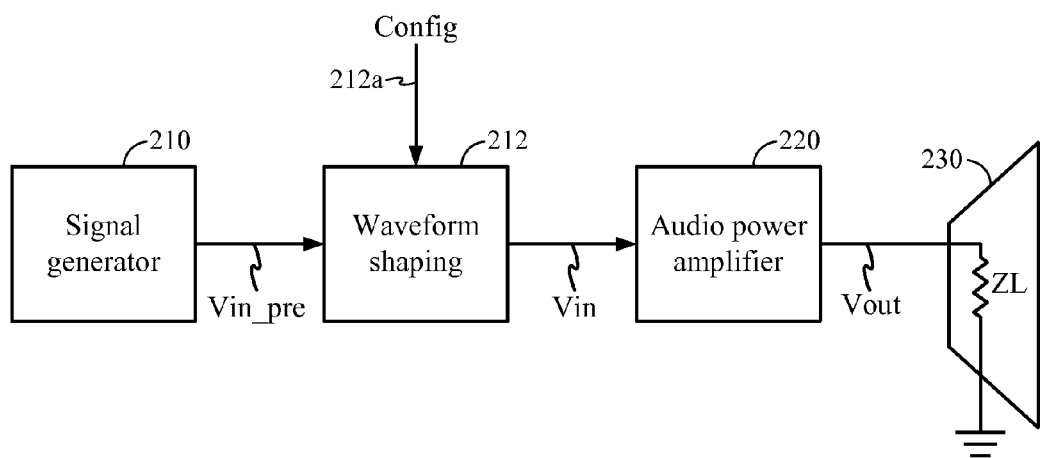
FIG. 5 illustrates an exemplary embodiment according to the present disclosure, wherein a waveform shaping block 212 is provided between the signal generator 210 and the audio amplifier 220.

FIG. 5 illustrates an exemplary embodiment according to the present disclosure, wherein a waveform shaping block 212 is provided between the signal generator 210 and the audio amplifier 220. The waveform shaping block 212 accepts as input the output generated by the signal generator 210, labeled as Vin_pre in FIG. 5. The waveform shaping block 212 further generates an output labeled Vin for the audio amplifier 220. During operation, the waveform shaping block 212 is configured to detect DC-to-DC transitions in the voltage Vin_pre, and to "shape" the corresponding transition in Vin according to a pre-selected transition waveform profile. The pre-selected waveform profiles may include, but are not limited to, Gaussian waveforms, raised-cosine waveforms, root-raised cosine waveforms, truncated sinc pulse waveforms, and/or other pulse shaping waveforms known in the art. Such waveform profiles may shape Vin to be generally nonlinear. Note in this context, the term "nonlinear" may denote that the DC-to-DC transition between voltage levels is not simply characterized by a straight line. For example, a non-linear waveform profile may be piecewise linear, i.e., including several distinct linear segments.

In an exemplary embodiment, the waveform shaping block 212 may be provided with a configuration signal 212a that indicates time intervals during which voltage transitions in Vin_pre may be advantageously shaped. In this manner, the waveform shaping block 212 may avoid unnecessarily shaping the signal generator output Vin_pre during time intervals when Vin_pre is known to contain only audio components. For example, the signal 212a may signal time intervals corresponding to power-up of the PA, power-down, or an impedance measurement mode. In alternative exemplary embodiments, the configuration signal 212a may be omitted, and the waveform shaping block 212 may instead be configured to determine when to shape Vin_pre based directly on analyzing Vin_pre.

Figure 6:
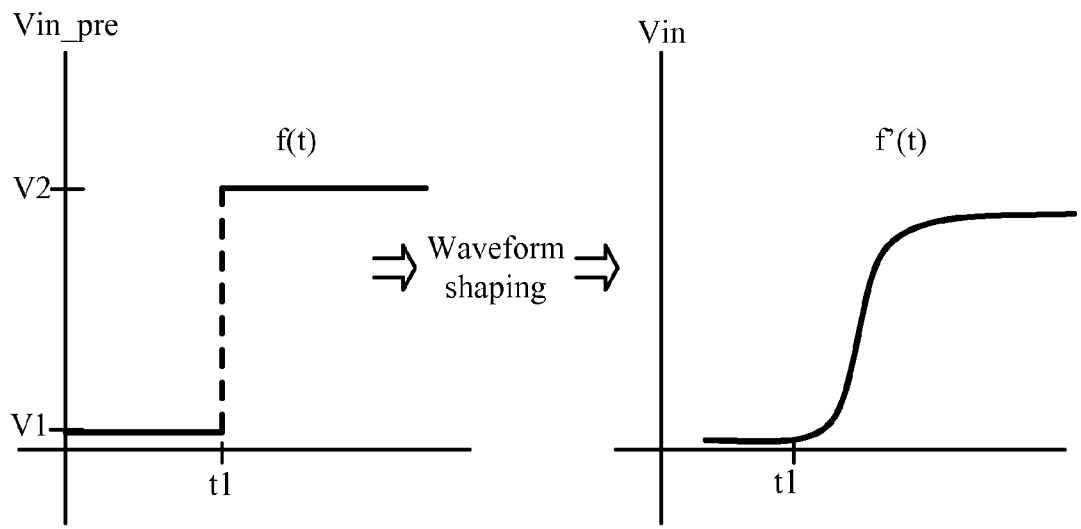
FIG. 6 illustrates time-domain plots of Vin_pre and Vin for an exemplary low-to-high voltage transition in Vin_pre.

FIG. 6 illustrates time-domain plots of Vin_pre and Vin for an exemplary low-to-high voltage transition in Vin_pre. In FIG. 6, Vin_pre is characterized by an exemplary time-domain function f(t) containing a low-to-high voltage transition at time t1. Following processing by the waveform shaping block 212, during a time interval when waveform shaping is applied, the voltage Vin is characterized by a shaped version f'(t) of the function f(t).

Figure 6A:
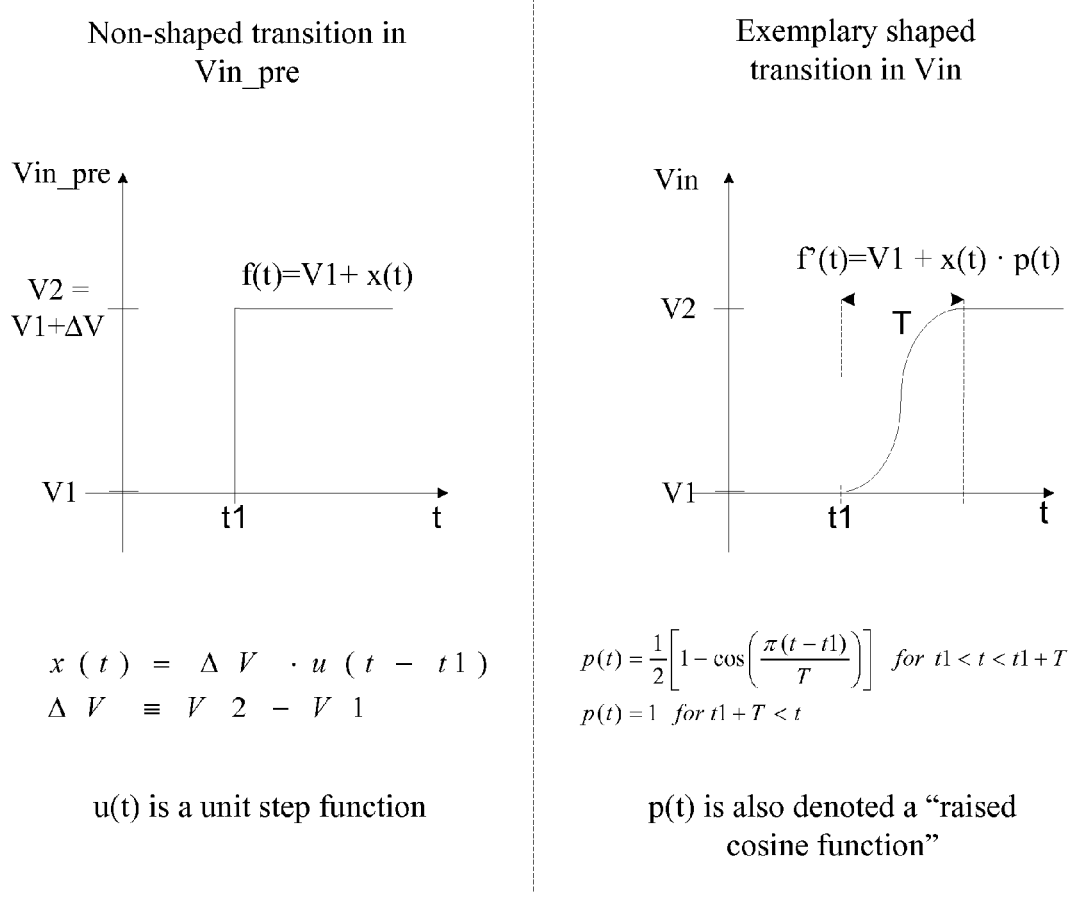
FIG. 6A illustrates an exemplary embodiment of a particular waveform shaping scheme.

FIG. 6A illustrates an exemplary embodiment of a particular waveform shaping scheme. Note the particular scheme for shaping f(t) to generate f'(t) shown in FIG. 6A is described for exemplary purposes only, and is not meant to limit the scope of the present disclosure to any particular waveform shaping scheme. In FIG. 6A, f(t) is shown on the left-hand side, and further mathematically characterized as the following function:

$$f(t)=V1+x(t)=V1+\Delta V \cdot u(t-t1);$$

wherein V1 is the initial voltage at time t1, $\Delta V$ is defined as the difference between the final (V2) and initial (V1) transition voltages in Vin_pre, · is the multiplication operation, and u(t) corresponds to the unit step function. Further shown on the right-hand side of FIG. 6A is the exemplary shaped waveform function f'(t), characterized as:

$$f'(t)=V1+x(t)\cdot p(t);$$

wherein p(t) is a raised cosine function, defined as shown in FIG. 6A.

Figure 6B:
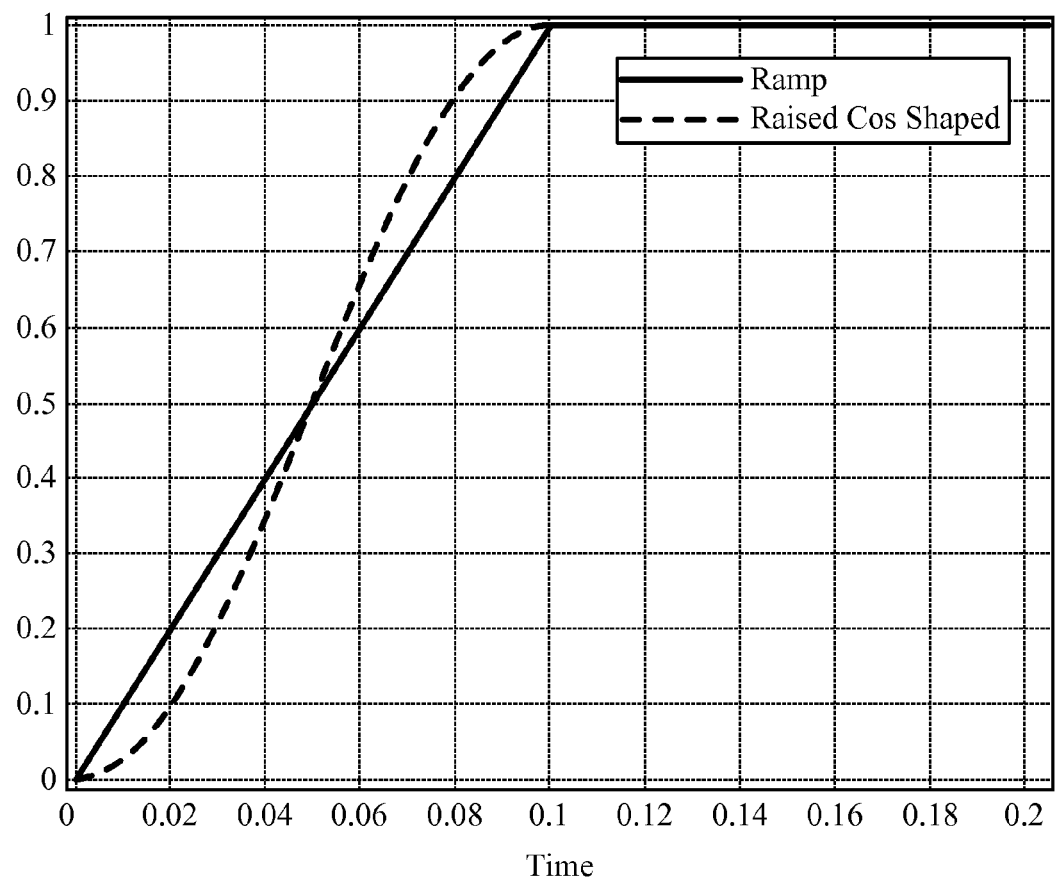
FIG. 6B illustrates a time-domain plot of Vin when a sample "raised cosine" waveform is applied to shape Vin.

FIG. 6B illustrates a time-domain plot of Vin when the exemplary raised cosine pulse described in FIG. 6A is applied to shape Vin. In FIG. 6B, the shaped waveform is compared to a ramped waveform (i.e., a transition processed according to a straight-line linear interpolation) over a horizontal time axis. Note that although both the raised cosine waveform and the ramp waveform converge to the desired DC level of Vout=1 after 1 time unit, the raised cosine waveform may converge to, e.g., 90% of the final Vout level earlier than does the ramp waveform, using an appropriately chosen T. Further note that the scale of the horizontal and vertical axes of FIG. 6B are arbitrarily chosen to highlight the principles of the disclosure, and are not meant to limit the scope of the present disclosure.

Figure 7:
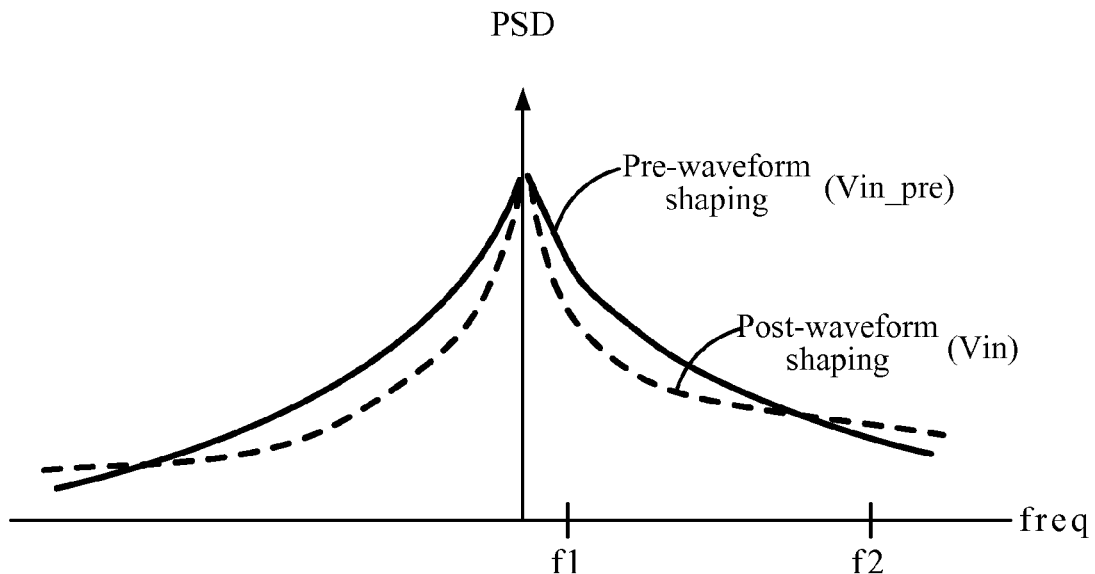
FIG. 7 illustrates the power spectral density plots of the time-domain signals shown in FIG. 6.

FIG. 7 illustrates exemplary power spectral density plots of the time-domain signals shown in FIG. 6. From FIG. 7, it will be appreciated that, as a result of the waveform shaping using, e.g., the raised cosine profile described herein, the power of Vin lying within the audible frequency range from f1 to f2 may be decreased relative to the power of the unshaped waveform Vin_pre.

In light of the description hereinabove, one of ordinary skill in the art will appreciate that the waveform shaping operation may be performed using other techniques not explicitly described herein. For example, pulse shapes other than the raised cosine pulse shape (e.g., Gaussian pulse shape, etc.) may be used to selectively shape the DC-to-DC level transitions, as described. Furthermore, alternative operations may also be applied, e.g., in certain exemplary embodiments, the time-domain function f(t) may be convolved with the selected shaped waveform impulse response to generate f'(t), i.e.:

$$f'(t)=f(t)*p(t);$$

wherein * denotes the convolution operation, and p(t) denotes the shaped waveform impulse response. Such alternative exemplary embodiments are contemplated to be within the scope of the present disclosure.

Figure 8:
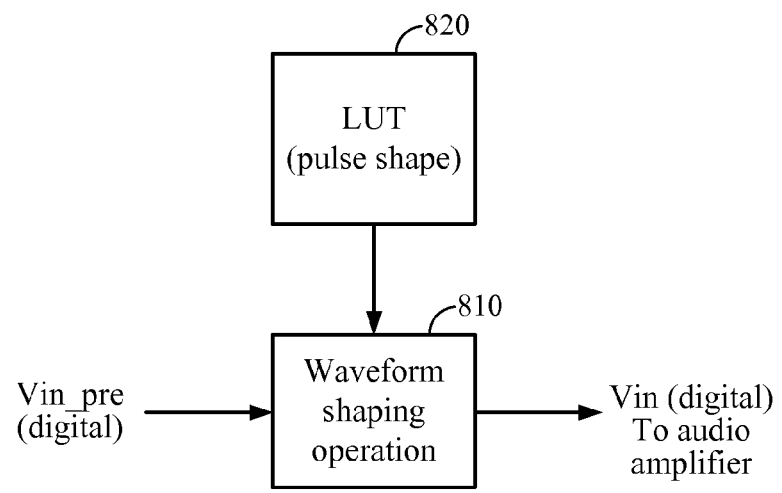
FIG. 8 illustrates an exemplary implementation of the waveform shaping block 212.

FIG. 8 illustrates an exemplary implementation of the waveform shaping block 212. Note FIG. 8 is shown for illustrative purposes only, and is not meant to limit the scope of the present disclosure to any particular implementation of a waveform shaping block. One of ordinary skill in the art will appreciate that, given the techniques disclosed herein, alternative implementations of the waveform shaping block may be derived, and such alternative exemplary embodiments are contemplated to be within the scope of the present disclosure.

In FIG. 8, Vin_pre is provided as a digital signal to the waveform shaping operation block 810. The block 810 may be configured to process Vin_pre according to waveform shaping operations as described hereinabove, with reference to pulse shape coefficients stored in a look-up table (LUT) 820. The output of block 810 is subsequently provided to the audio amplifier, as earlier described hereinabove. Note further stages (not shown in FIG. 8) may be provided between the block 810 and the audio amplifier, e.g., digital-to-analog conversion (DAC) circuitry, and/or other pre-processing circuitry to convert the digital output of block 810 to a form suitable for driving the audio amplifier.

In an alternative exemplary embodiment, a pulse waveform may be generated using equations that are computed in a processor or other digital circuits, and such pulse waveform may be used to shape the signal according to the techniques described herein.

Figure 9:
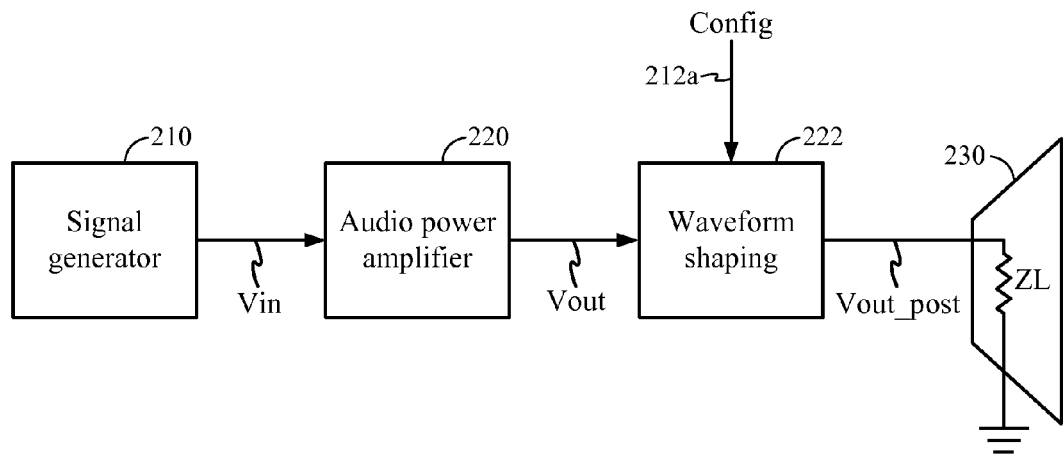
FIG. 9 illustrates an alternative exemplary embodiment wherein a waveform shaping block is provided between the audio amplifier and the audio load.

FIG. 9 illustrates an alternative exemplary embodiment wherein a waveform shaping block is provided between the audio amplifier and the audio load. In FIG. 9, the waveform shaping block 222 is provided with the output voltage Vout of the audio amplifier 220, and the waveform shaping block 222 subsequently generates a shaped output voltage Vout_post for the audio load 230. Note in this exemplary embodiment, the output of the audio amplifier 220 may be an analog voltage, and thus the waveform shaping block 222 may incorporate the appropriate component circuitry for processing and waveform shaping an analog voltage. For example, the waveform shaping block 222 may include one or more analog-to-digital converters (ADC's) to convert Vout to the digital domain for digital processing, followed by one or more digital-to-analog converters (DAC's). Alternatively, the waveform shaping block 222 may process and shape the analog voltages directly in the analog domain. Such alternative exemplary embodiments are contemplated to be within the scope of the present disclosure.

In an exemplary embodiment, the waveform shaping block 222 may also be embedded in the output stage of the audio amplifier 220.

Figure 10:
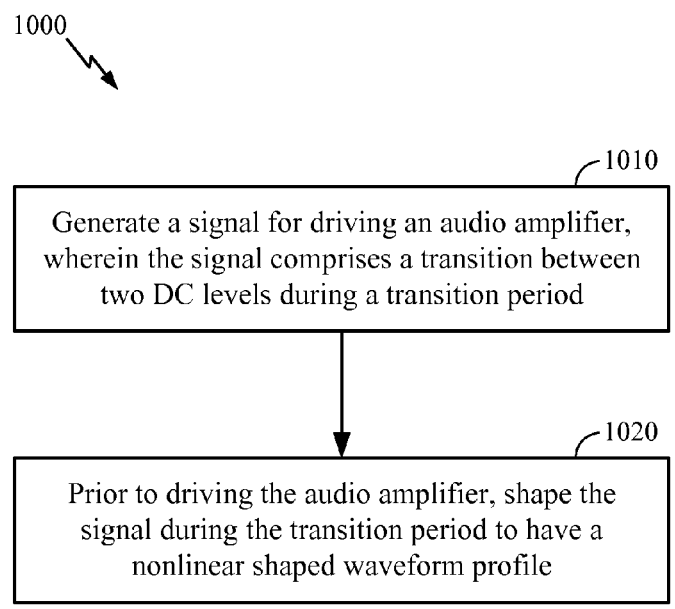
FIG. 10 illustrates an exemplary embodiment of a method according to the present disclosure.

FIG. 10 illustrates an exemplary embodiment of a method 1000 according to the present disclosure. Note the method of FIG. 10 is shown for illustrative purposes only, and is not meant to limit the scope of the present disclosure to any particular method shown.

In FIG. 10, at block 1010, a signal is generated for driving an audio amplifier. The signal comprises a transition between two DC levels during a transition period.

At block 1020, prior to driving the audio amplifier, the signal is shaped during the transition period to have a nonlinear shaped waveform profile.

Figure 11:
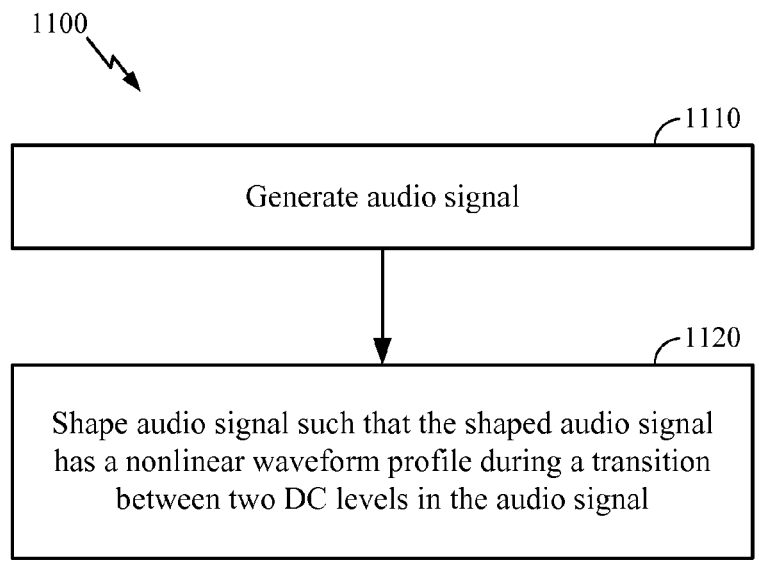
FIG. 11 illustrates an alternative exemplary embodiment of a method according to the present disclosure.

FIG. 11 illustrates an alternative exemplary embodiment of a method 1100 according to the present disclosure. At block 1110, an audio signal is generated.

At block 1120, the audio output signal is shaped such that the shaped audio signal has a nonlinear shaped waveform profile during a transition between two DC levels in the audio signal.

Figure 12:
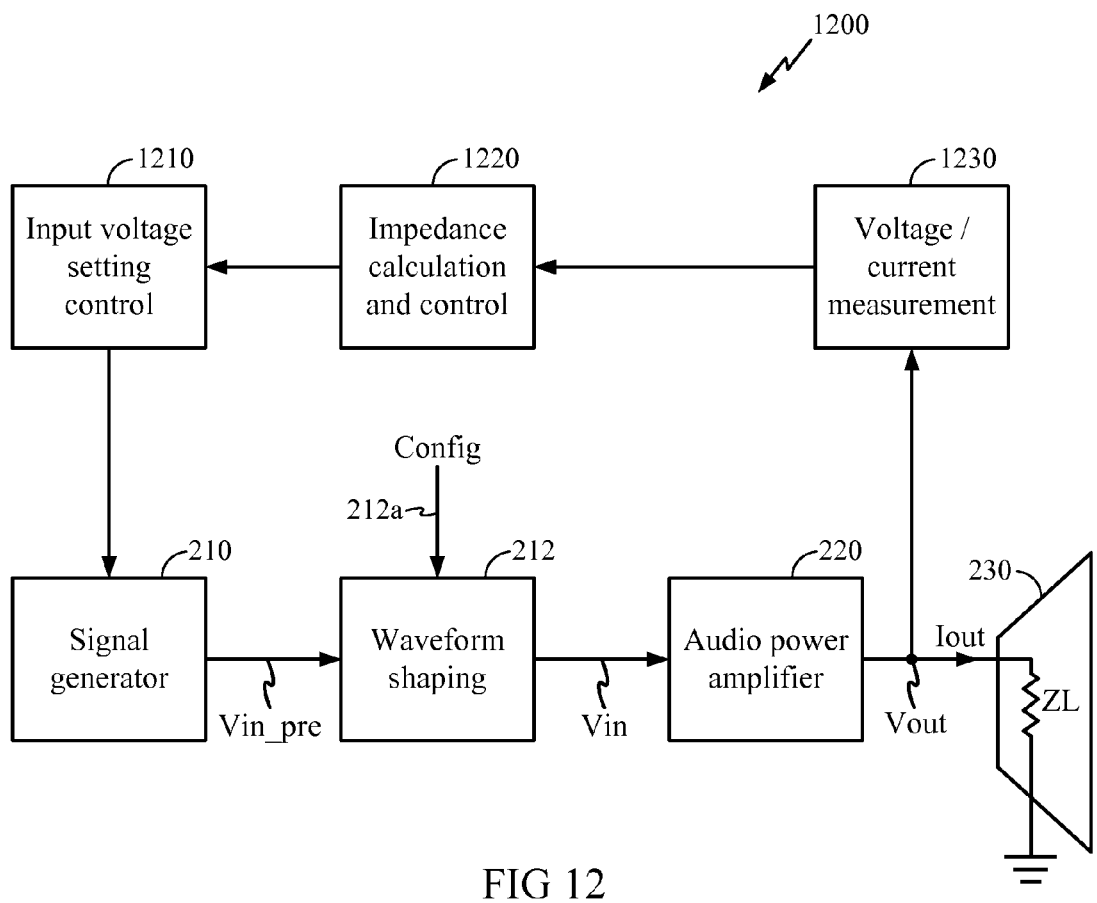
FIG. 12 illustrates an exemplary embodiment of a system combining load impedance measurement with waveform shaping techniques according to the present disclosure.

FIG. 12 illustrates an exemplary embodiment of a system combining load impedance measurement with waveform shaping techniques according to the present disclosure. Note the exemplary embodiment of FIG. 12 is shown for illustrative purposes only, and is not meant to limit the scope of the present disclosure to any particular implementation of a load impedance measurement system. One of ordinary skill in the art will appreciate that the techniques disclosed herein may be readily applied to generate waveform shaped signals for alternative load impedance measurement systems.

In FIG. 12, an impedance measurement and control block 1220 programs an input voltage setting control block 1210. The block 1210 sets the voltage Vin_pre output by the signal generator to one of a plurality of voltages that are suitable for determining the impedance of the audio load 230, as later described hereinbelow. Following processing by the waveform shaping block 212 and audio amplifier 220, the audio amplifier 220 drives the audio load 230 with an output voltage Vout and output current Iout. A voltage/current measurement block 1230 may measure the voltage Vout driving the audio load 230 concurrently with the corresponding current Iout drawn by the audio load 230. These voltage and current measurements are provided back to the impedance calculation and control block 1220, which calculates the impedance of the audio load 230 based on the measured voltage and current.

Note techniques for measuring the impedance of audio load 230 known in the art may preferably configure the signal generator 210 to generate a plurality of settings for Vin_pre, such that Vout is correspondingly set at a plurality of corresponding values over time. For example, in an exemplary embodiment, it may be desirable to set Vin_pre to at least two DC voltage settings Vin_pre(1) and Vin_pre(2), thereby generating at least two corresponding Vout values Vout(1) and Vout(2). The two or more distinct voltage settings Vout(1) and Vout(2) enable the voltage/current measurement block 1130 to obtain at least two corresponding voltage-current measurements (Vout, Iout), thus affording a more accurate measurement mechanism.

In an exemplary embodiment, when the signal generator 210 is configured to set Vin_pre to multiple voltage settings during impedance measurement, the waveform shaping techniques of the present disclosure may be applied to shape Vin_pre to generate a shaped waveform Vin. For example, the configuration signal 212a may configure the waveform shaping block 212 to perform waveform shaping when the system 1200 is in an impedance measurement mode. In an exemplary embodiment, in the impedance measurement mode, when Vin_pre is set to Vin_pre(1) and Vin_pre(2) in succession, the waveform shaping block 212 may apply the waveform shaping techniques of the present disclosure, such that the transition from Vin(1) to Vin(2) (resulting from the transition of Vin_pre(1) to Vin_pre(2)) is waveform shaped. This advantageously reduces possible audio artifacts associated with the transitions, while also minimizing the transition time.

It will be appreciated that the waveform shaping techniques are also readily applied to accommodate more than two settings of Vin_pre, as may be generated when the impedance measurement calls for more than two distinct voltage-current measurements (Vout, Iout). Furthermore, the impedance measurement system of FIG. 12 may also readily accommodate the exemplary embodiment of FIG. 9, i.e., wherein the waveform shaping block follows the audio amplifier. Such alternative exemplary embodiments are contemplated to be within the scope of the present disclosure.

Note while certain references are made herein to "voltage" transitions, one of ordinary skill in the art will appreciate that the techniques disclosed herein may also be readily applied to other types of transitions, e.g., current transitions and/or other types of transitions in electromagnetic signals. Such alternative exemplary embodiments are contemplated to be within the scope of the present disclosure.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
    signal generator configured to generate a generator output signal comprising an audio component and an impedance measurement component;
    an impedance measurement block coupled to the signal generator, the impedance measurement block configured to set the impedance measurement component during impedance measurement time intervals; and
    a waveform shaping block configured to receive a configuration signal configured to indicate one or more time intervals to shape the generator output signal, the waveform shaping block further configured to shape the generator output signal to have a nonlinear shaped waveform profile during the the one or more indicated time intervals.

2. The apparatus of claim 1, the nonlinear shaped waveform profile comprising a raised cosine profile.

3. The apparatus of claim 1, the nonlinear shaped waveform profile comprising a Gaussian waveform profile.

4. The apparatus of claim 1, the nonlinear shaped waveform profile comprising a plurality of piecewise linear segments.

5. The apparatus of claim 1, the waveform shaping block comprising a digital look-up table storing a nonlinear shaped waveform profile, the waveform shaping block configured to digitally multiply transitions between DC signal levels in the impedance measurement component with the nonlinear shaped waveform profile.

6. The apparatus of claim 1, the waveform shaping block comprising a digital look-up table storing a nonlinear shaped waveform profile, the waveform shaping block configured to digitally convolve the impedance measurement component with the nonlinear shaped waveform profile.

7. The apparatus of claim 1, the configuration signal further indicating when an audio amplifier coupled to the output of the waveform shaping block is powered on or off.

8. The apparatus of claim 1, further comprising an audio power amplifier configured to amplify the output of the waveform shaping block.

9. A method comprising:
    generating a generator output signal comprising an audio component and an impedance measurement component;
    setting the impedance measurement component during one or more indicated time intervals;
    shaping the generator output signal to have a nonlinear shaped waveform profile during the one or more indicated time intervals.

10. The method of claim 9, further comprising:
    amplifying a result of the shaping the generator output signal using an audio power amplifier.

11. A method comprising:
    generating an audio signal;
    shaping the audio signal such that the shaped audio signal has a nonlinear shaped waveform profile during a transition between two DC levels in the audio signal;
    amplifying the shaped audio signal using an audio power amplifier;
    sampling at least an output voltage and an output current of the audio power amplifier;
    calculating a load impedance based on the sampled output voltage and output current; wherein:
    the generating the audio signal comprises setting the signal at a plurality of levels for the calculating the load impedance.

12. The method of claim 11, the nonlinear shaped waveform profile comprising a raised cosine profile, and wherein the transition occurs during an initialization of the audio power amplifier.

13. An apparatus comprising:
    means generating a generator output signal comprising an audio component and an impedance measurement component; and
    means for setting the impedance measurement component during one or more indicated time intervals;
    means for shaping the generator output signal to have a nonlinear shaped waveform profile during the one or more indicated time intervals.

14. The apparatus of claim 13, further comprising an audio power amplifier coupled to the output of the means for shaping.

\* \* \* \* \*